United States Patent
Batruni (10) Patent No.: US 7,446,682 B2
(45) Date of Patent: *Nov. 4, 2008

(54) ANALOG TO DIGITAL CONVERTER WITH DISTORTION CORRECTION

(75) Inventor: Roy G. Batruni, Danville, CA (US)

(73) Assignee: Optichron, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/293,416

(22) Filed: Dec. 2, 2005

(65) Prior Publication Data

US 2006/0082479 A1   Apr. 20, 2006

Related U.S. Application Data

(63) Continuation of application No. 11/031,609, filed on Jan. 5, 2005, now Pat. No. 7,002,495, which is a continuation of application No. 10/641,332, filed on Aug. 14, 2003, now Pat. No. 6,885,323.

(60) Provisional application No. 60/483,493, filed on Jun. 27, 2003, provisional application No. 60/486,053, filed on Jul. 10, 2003.

(51) Int. Cl.
*H03M 1/10* (2006.01)

(52) U.S. Cl. ........................ 341/120; 341/118

(58) Field of Classification Search ............ 341/118, 341/120

See application file for complete search history.

(56) References Cited

U.S. PATENT DOCUMENTS

| | | | |
|---|---|---|---|
| 4,435,823 A | 3/1984 | Davis et al. | |
| 4,563,681 A | 1/1986 | Godard | |
| 4,779,225 A | 10/1988 | Fukasawa et al. | |
| 4,843,583 A | 6/1989 | White et al. | |
| 4,905,101 A | 2/1990 | Ohta et al. | |
| 5,182,558 A | 1/1993 | Mayo | |
| 5,257,026 A * | 10/1993 | Thompson et al. | 341/118 |
| 5,302,909 A | 4/1994 | Kettenis et al. | |
| 5,388,080 A | 2/1995 | Feintuch et al. | |

(Continued)

FOREIGN PATENT DOCUMENTS

EP    0 460 840 A2    12/1991

(Continued)

OTHER PUBLICATIONS

U.S. Appl. No. 11/033,344, Roy G. Batruni.

(Continued)

*Primary Examiner*—Jean B. Jeanglaude
*Assistant Examiner*—Joseph Lauture
(74) *Attorney, Agent, or Firm*—Van Pelt, Yi & James LLP (57) ABSTRACT

A system and method are disclosed for correcting for output distortion of an analog to digital converter, comprising: estimating the output distortion, providing an estimated distortion, and combining an output of the analog to digital converter with the estimated distortion to compensate for the output distortion. The compensating module for correcting output distortion of an analog to digital converter comprises a calibration module configured to estimate the output distortion and a combiner configured to combine an output of the analog to digital converter with the estimated distortion to compensate the output distortion.

16 Claims, 10 Drawing Sheets

U.S. PATENT DOCUMENTS

| | | | |
|---|---|---|---|
| 5,483,288 | A | 1/1996 | Hong |
| 5,535,246 | A | 7/1996 | Beech |
| 5,685,317 | A | 11/1997 | Sjostrom |
| 6,181,754 | B1 | 1/2001 | Chen |
| 6,198,416 | B1 * | 3/2001 | Velazquez ............... 341/118 |
| 6,351,740 | B1 | 2/2002 | Rabinowitz |
| 6,424,276 | B1 | 7/2002 | Munoz et al. |
| 6,538,592 | B1 | 3/2003 | Yang et al. |
| 6,738,482 | B1 | 5/2004 | Jaber |
| 6,856,191 | B2 | 2/2005 | Batruni |
| 6,885,323 | B2 | 4/2005 | Batruni |
| 7,002,495 | B1 * | 2/2006 | Batruni ............... 341/118 |
| 7,026,967 | B2 * | 4/2006 | Eloranta ............... 341/120 |
| 2001/0026232 | A1 * | 10/2001 | Andersson ............... 341/118 |

FOREIGN PATENT DOCUMENTS

| | | |
|---|---|---|
| EP | 0 964 524 A2 | 12/1999 |

OTHER PUBLICATIONS

U.S. Appl. No. 11/036,662, Roy G. Batruni.

Frank, Walter A., "An Efficient Approximation to the Quadratic Volterra Filter and Its Application I Realtime Loudspeaker Linearization," Universitat der Bundeswehr Munchen, D85577 Neubiberg Germany, date unknown.

Frank, Walter A., "On the Equalization of Nonlinear Systems," Universitat der Bundeswehr Munchen, Neubiberg, Germany, date unknown.

Giannakis, Georgios B., "Blind Franctionally Spaced Equalization of Noisy FIR Channels: Direct and Adaptive Solutions," IEEE Transactions on Signal Processing, vol. 45, No. 9, Sep. 1997.

Griffith, David W., Jr. et al, "Partially Decoupled Volterra Filters: Formulation and LMS Adaptation," Dept. of Electrical Engineering, University of Delaware, Newark, Delaware, date unknown.

Schulz-Mirbach, Hanns, "Nonlinear Model-Based Analysis and Description of Images for Multimedia Applications," Internal Report Jul. 1996, TU Hamburg-Harburg, Technische Informatik I, Oct. 1996.

Feintuch, P. L., "An Adaptive Recursive LMS Filter," Proceedings from the IEEE, vol. 64, No. 11, Nov. 1976, pp. 1622-1624.

Frank, Walter: "Compensation of Linear and Nonlinear Sensor Distortions by Digital Post Processing" Sensor. Proceedings International Conference for Sensors Transducers and Systems, XX, XX, 1995, pp. 889-892, XP002363900.

Jun Ming et al: "An 8-bit 80-Msample/s Pipelined Analog-to Digital Converter With Background Calibration" IEEE Journal of Solid-State Circuits, IEEE Service Center, Piscataway, NJ, US, vol. 36, No. 10, Oct. 2001, XP011061609 ISSN: 0018-9200.

Sung-Ung Kwak et al: "A 15-b, 5-Msample/s Low-Spurious CMOS ADC" IEEE Journal of Solid-State Circuits, IEEE Service Center, Piscataway, NJ, US, vol. 32, No. 12, Dec. 1997, XP011060625 ISSN: 0018-9200, p. 1871.

Walter Frank: "Compensation of Linear and Nonlinear Sensor Distortions by Digital Post Processing" Sensor. Proceedings International Conference for Sensors Tranducers and Systems, 1995, pp. 889-892, XP002363900.

* cited by examiner

ANALOG TO DIGITAL CONVERTER WITH DISTORTION CORRECTION

CROSS REFERENCE TO RELATED APPLICATIONS

This application is a continuation of Ser. No. 11/031,609 filed Jan. 05, 2005, now U.S. Pat. No. 7,002,495, which is a continuation of U.S. patent application Ser. No. 10/641,332 now U.S. Pat. No. 6,885,323 entitled ANALOG TO DIGITAL CONVERTER filed Aug. 14, 2003 which is incorporated herein by reference for all purposes, which claims priority to U.S. Provisional Patent Application No. 60/483,493 entitled ANALOG-TO-DIGITAL CONVERTER filed Jun. 27, 2003, and claims priority to U.S. Provisional Patent Application No. 60/486,053 entitled ANALOG-TO-DIGITAL CONVERTER filed Jul. 10, 2003, which are incorporated herein by reference for all purposes.

FIELD OF THE INVENTION

The present invention relates generally to analog to digital converters (ADCs). More specifically, distortion correcting analog to digital converters (DCADCs) and methods for correcting distortion are disclosed.

BACKGROUND OF THE INVENTION

An analog to digital converter (ADC) is a device used to map continuous time signals to sampled time digital values. It is widely used in electronic systems.

An ideal ADC does not have any errors in its output. A sinusoidal input signal sampled by an ideal ADC does not have any harmonics in the frequency domain. In practice, however, ADCs are not ideal. Mismatches and nonlinearity of ADC elements introduces errors that distort the output of the ADC. The sampled sinusoidal signal has harmonics in the frequency domain, and the signal fidelity is degraded.

Figure 1:
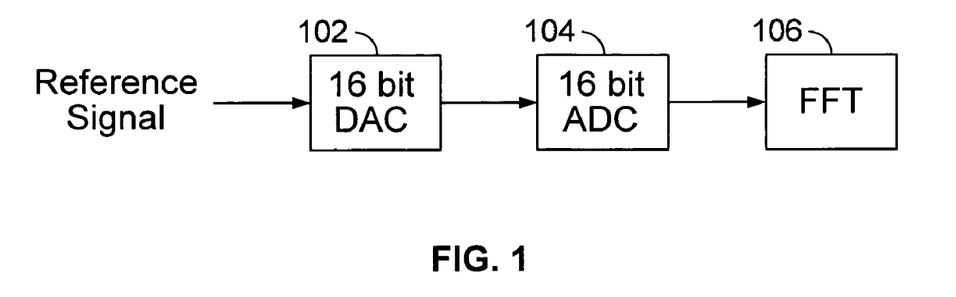
FIG. 1 is a block diagram illustrating a system used to improve the quality of ADCs.

The quality of ADCs may be improved by trimming the ADCs to achieve desired transfer characteristics. FIG. 1 is a block diagram illustrating a system used to improve the quality of ADCs. A digitized sinusoidal reference signal is sent to a 16-bit digital to analog converter (DAC) 102. The DAC has good transfer characteristics and low noise. Its output is sent to a 16-bit ADC 104 that is under test. The ADC samples the output of the DAC, and sends its output to a filter 106 that performs a Fast Fourier Transform (FFT). If the output of the FFT is determined to have significant harmonic distortion, certain components of the ADC are trimmed. The trimming process usually changes the resistance or capacitance of the ADC, which may in turn reduce the harmonic distortion of the ADC.

There are several issues associated with the trimming technique. It takes time to test and trim the ADC, which increases the production cost. The design of trimming circuits also increases the complexity of the ADC. Furthermore, trimming the circuitry to adjust the transfer characteristics of the ADC for one frequency may adversely affect the transfer characteristics of the ADC for other frequencies. It would be desirable to have a technique that could correct the distortions in the ADC, without increasing the complexity of the circuitry or the production cost. It would also be useful if the technique could correct the distortions over the operating spectrum of the ADC.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, are referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and invention may be practiced according to the claims without some or all of these specific details. For the purpose of clarity, technical material that is known in the technical fields related to the invention has not been described in detail so that the invention is not unnecessarily obscured.

An improved technique for correcting distortion in the output of an analog to digital converter is disclosed. In some embodiments, a distortion correcting analog to digital converter (DCADC) employs a calibration module that is trained to compensate the distortion in the output of a conventional ADC. In some embodiments, the calibration module models the interference effects of the most significant bits (MSBs) on the least significant bits (LSBs). The calibration module may be trained using a random noise generator, a custom digital to analog converter (DAC) or a noisy DAC. In some embodiments, the calibration module includes a nonlinear digital signal processor (DSP) that is comprised of linear filters and nonlinear elements. The DCADC may include several ADC stages and several calibration modules. The DCADC can be used to correct distortions in the overall circuit in some embodiments. The techniques described are applicable to various types of ADC architectures, including pipelining, folding, and sigma delta.

Figure 2A:
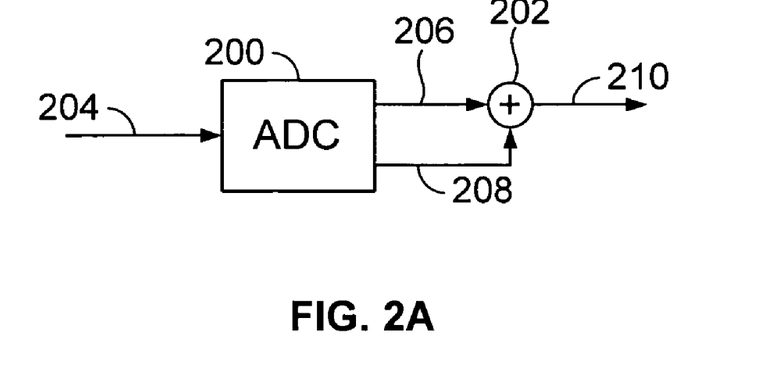
FIG. 2A is a block diagram illustrating the operations of an analog to digital converter according to one embodiment.

FIG. 2A is a block diagram illustrating the operations of an analog to digital converter according to one embodiment. ADC 200 has N bits of outputs, where N is an integer. Each quantized output bit of the ADC is denoted as $m_j$, where $j \in \{0,1,\ldots,N-1\}$ and $m_j \in \{0,1\}$. The input to ADC 200 is analog signal 204, which can be represented as the following:

$$x = m_{N-1}2^{N-1} + m_{N-2}2^{N-2} \ldots + m_1 2^1 + m_0 2^0 + u \quad \text{(Equation 1),}$$

where u is the value of the signal that is below the finest ADC quantization level. The output of an ideal ADC can be expressed as:

$$y_i = m_{N-1}2^{N-1} + m_{N-2}2^{N-2} \ldots + m_1 2^1 + m_0 2^0 \quad \text{(Equation 2).}$$

In practice, the ADC output has some distortion. Its output may be viewed as a combination of two components: an ideal output component 206 and a distortion component 208. The two components are combined to give the actual output 210. As used herein, combining refers to subtraction, summation, or any other appropriate operation performed on two or more signals.

Figure 2B:
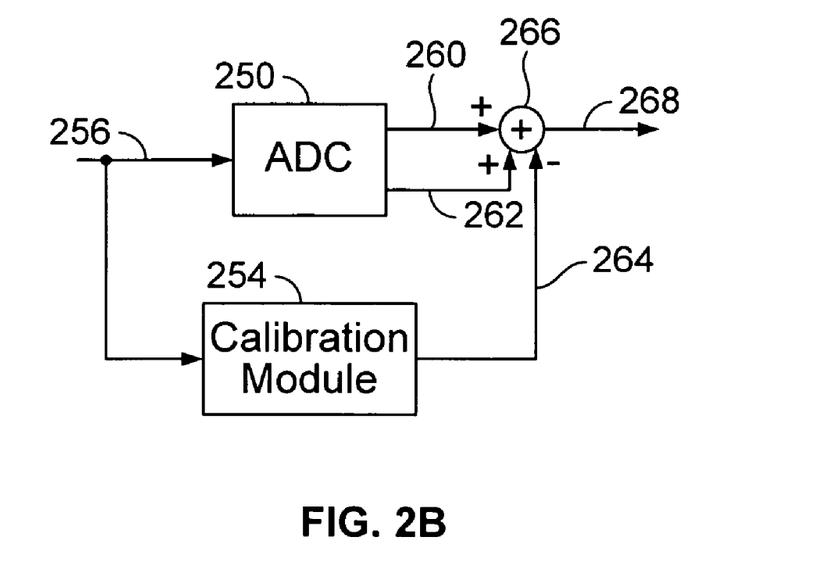
FIG. 2B is a diagram illustrating a distortion correcting analog to digital converter according to one embodiment of the present invention.

FIG. 2B is a diagram illustrating a distortion correcting analog to digital converter according to one embodiment of the present invention. The DCADC includes an ADC 250 that includes a digitizing circuit that converts an analog signal to digital, and a calibration module 254. The components of the DCADC may be implemented as a single integrated circuit, separate discrete components or any other appropriate scheme. The output of ADC 250 includes and ideal output component 260 and a distorted output component 262. A calibration module 254 is used to generate a signal that models the distorted output component. Combiner 266 subtracts the output of the calibration module from the output of the ADC, outputting signal 268 that is approximately the ideal output.

The distorted output component can be modeled as the following:

$$y = m_{N-1}k_{N-1}2^{N-1} + m_{N-2}k_{N-2}2^{N-2} \ldots + m_1 k_1 2^1 + m_0 k_0 2^0 \quad \text{(Equation 3),}$$

where $k_j$ is a constant that is equal to 1 ideally, but may deviate from 1 by some quantization offset when distortion is present. For example, if $k_{N-1}=1.001$ and if $m_{N-1}=1$, then the contribution of the term $m_{N-1}k_{N-1}2^{N-1}$ to the quantization is $2^{N-1} + 0.001 \cdot 2^{N-1}$, where $2^{N-1}$ is the desired output bit and $0.001 \cdot 2^{N-1}$ is the distortion; if $m_{N-1}=0$, then the term does not contribute to the distortion error. Similar analysis is applicable to any $m_j$.

Other equations may also be used to model more complex forms of distortion. In some embodiments, the output also includes a component u representing distortion that is a function of cross terms of the bits, such as the following:

$$u = m_{N-1}q_{N-1}m_{N-2}q_{N-2}2^{N-2} + m_{N-2}q_{N-2}m_{N-3}q_{N-3}2^{N-3} \quad \text{(Equation 4).}$$

For the same quantization error offsets in the most-significant bits (MSBs) and least-significant bits (LSBs), higher order bits make a greater contribution to the distortion than the lower order bits. Returning to Equation 3, in an ADC where N=8, $k_1$ and $k_{N-1}$ are both 0.001, the corresponding contributions to distortion are $0.001 \cdot 2^1$ for bit 1 and $0.001 \cdot 2^7$ for bit 7. Thus, in practice, most of the ADCs output distortion comes from the quantization offsets of its higher order bits. Furthermore, the contributions of the higher order bits are geometrically more significant than the contributions of the lower order bits. Thus, DCADCs can achieve good performance without having to correct the errors associated with the lower order bits.

Figure 3:
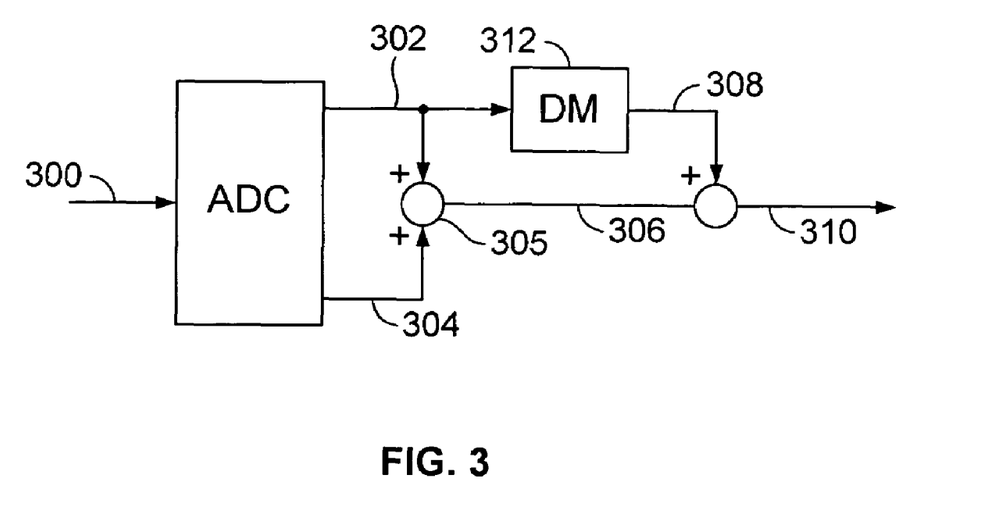
FIG. 3 is a block diagram illustrating an analog to digital converter model with distortion, according to one embodiment of the present invention.

FIG. 3 is a block diagram illustrating an analog to digital converter model with distortion, according to one embodiment of the present invention. Signal 300 is the analog input to an N-bit ADC, denoted as $X_n$. The ideal output of the ADC is divided into two components, signals 302 and 304. Component 302 includes k of the most significant bits. Component 304 includes (N−k) of the least significant bits. Combiner 305 combines signals 302 and 304, outputting an ideal ADC signal 306. To approximate the effects of distortion, only the most significant bits are operated on by distortion model 312. The output of the distortion model, signal 308, is the distortion component. Ideal output 306 and distortion component 308 are combined to produce the actual output, signal 310.

The actual output of an ADC can be expressed as the following in some embodiments:

$$w = m_{N-1}2^{N-1} + m_{N-2}2^{N-2} \ldots + m_1 2^1 + m_0 2^0 + f(m_{N-1}, m_{N-2}, m_{N-3}, m_{N-4}) \quad \text{(Equation 5),}$$

where $f(m_{N-1}, m_{N-2}, m_{N-3}, m_{N-4})$ is the transfer function of the distortion model. In some embodiments, it is a nonlinear function of the higher order bits. Note that the distortion resulting from the lower order bits is neglected and that the number of higher order bits selected for the nonlinear function depends on implementation and may vary for other embodiments. Alternatively, w may be expressed as:

$$w = y + f(m_j) \quad \text{(Equation 6),}$$

where y is the ideal ADC output and $f(m_j)$ is a nonlinear function of the output bits. The quantization error, $\epsilon$, can be expressed as a difference between the actual output and the input:

$$\epsilon = w - x = f(m_{N-1}, m_{N-2}, m_{N-3}, m_{N-4}) - u \quad \text{(Equation 7).}$$

Figure 4A:
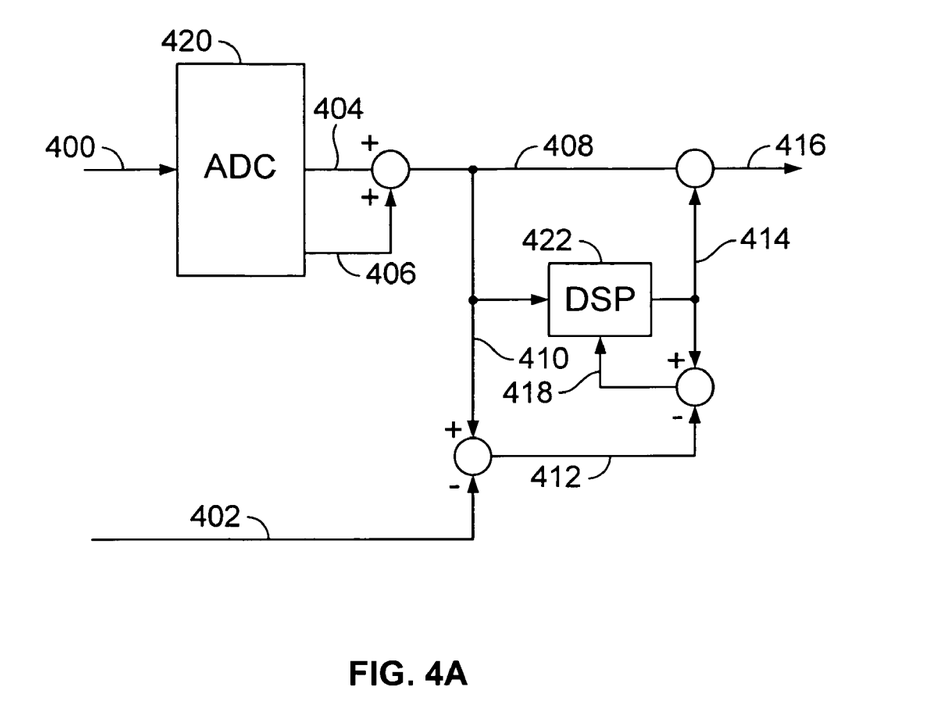
FIG. 4A is a block diagram illustrating a DCADC in training mode, according to one embodiment of the present invention.

In some embodiments, the DCADC includes a calibration module trained to model the nonlinear distortion component $f(m_{N-1}, m_{N-2}, m_{N-3}, m_{N-4})$ of the ADC. The output of the ADC can be corrected by subtracting the nonlinear distortion component from its actual output. FIG. 4A is a block diagram illustrating a DCADC in training mode, according to one embodiment of the present invention. In this embodiment, the calibration module includes a digital signal processor (DSP) 422. Signal 400 is an analog input signal to ADC 420. The output of the ADC includes an ideal output signal 404 and a distortion component 406. Signals 404 and 406 are combined to form the ADCs actual output 408. Signal 408 is sent to DSP 422 that outputs an estimated distortion signal 414. DSP 422 adapts to improve its estimated distortion by minimizing the difference between the estimated distortion and the output distortion.

Signal 402 is an ideal digitized version of signal 400 used to train the calibration module. Signal 402 is virtually free from distortion. It is subtracted from signal 408, to form a distortion signal 412. The difference between the distortion signal and the simulated distortion signal, signal 418, is the error adaptation signal. Signal 418 is fed back to the DSP so that the DSP may adapt itself to minimize the error adaptation signal and better model the distortion. Details of the DSP and its adaptation techniques will be discussed later.

Figure 4B:
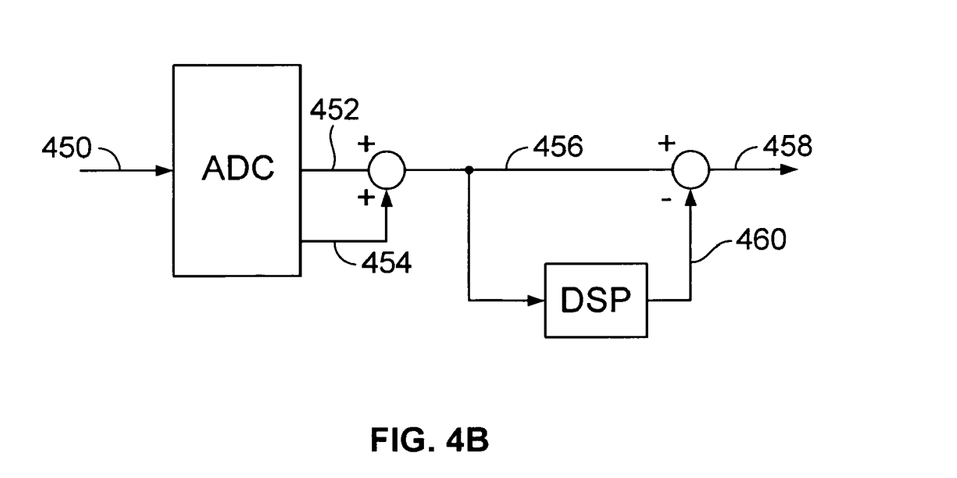
FIG. 4B is a block diagram illustrating the steady state operation of the ADC embodiment show in FIG. 4A.

FIG. 4B is a block diagram illustrating the steady state operation of the ADC embodiment shown in FIG. 4A. In steady state, the adaptation path of the DSP is disconnected. The DSP uses the configuration it obtained during the training process to model the distortion and output a distortion signal 460. The distortion signal is subtracted from the output of the ADC, signal 456. The resulting signal 458 is error-corrected and has substantially less distortion than signal 456.

In practice, however, an ideal training signal may not be available. Several approaches that do not require an ideal training signal are discussed. These approaches take advantage of the principle that uncorrelated analog input signal leads to uncorrelated quantized output bits for an ideal ADC. The following example illustrates the principle.

Assuming that the overall distortion is relatively small, the amount of distortion may be represented in terms of the LSBs. Let the nonlinear distortion be the following:

$$f(m_{N-1}, m_{N-2}, m_{N-3}, m_{N-4}) = m_{N-1}2^1 + m_{N-2}2^0 \quad \text{(Equation 8)}.$$

The actual output of the DSP can be expressed as the following:

$$w = m_{N-1}2^{N-1} + m_{N-2}2^{N-2} \ldots + (m_1 + m_{N-1})2^1 + (m_0 + m_{N-2})2^0 \quad \text{(Equation 9)}.$$

Bits N−1 and 1 are correlated since they both have a common component $m_{N-1}$; bits N−2 and 0 are also correlated since they both have a common component $m_{N-2}$. In this example, the calibration module is trained to output a simulated distortion signal $(m_{N-1})2^1 + (m_{N-2})2^0$ that is subtracted from w. The resulting signal is a corrected output that is approximately equal to the ideal ADC output.

Figure 5:
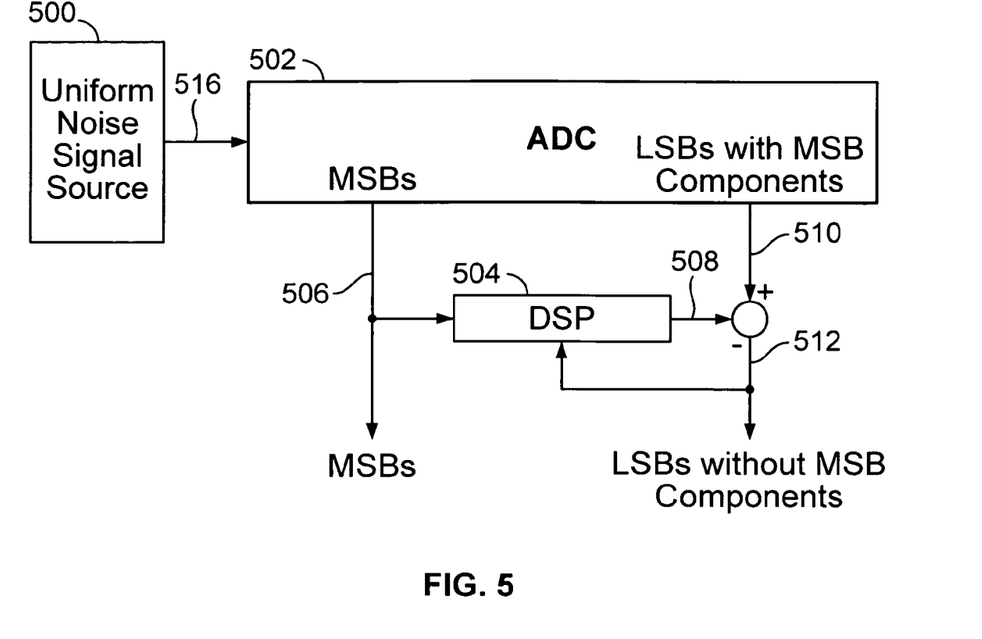
FIG. 5 is a block diagram illustrating a DCADC embodiment trained using a noise signal source.

To properly train the calibration module, the training input signal of the ADC is preferably random, uniformly distributed and uncorrelated. FIG. 5 is a block diagram illustrating a DCADC embodiment trained using a noise signal source. Uniform noise signal source 500 provides an analog signal 516 that is random and uncorrelated. The uniform noise signal source may be implemented using a thermal noise source or any other appropriate elements. Signal 516 is sent to ADC 502. If ADC 502 were ideal, its output would be random uncorrelated bits. In practice, however, the ADC is not ideal and its output bits are not completely uncorrelated. In this embodiment, the output of ADC 502, w, is the same as the w shown in Equation 8. Output signal 506 of the ADC includes two MSBs, and can be expressed as the following:

$$y_{MSB} = m_{N-1}2^{N-1} + m_{N-2}2^{N-2} \quad \text{(Equation 10)}.$$

Output signal 510 of the ADC includes two LSBs as well as the distortion components associated with the MSBs. It can be expressed as:

$$y_{LSBE} = (m_1 2^1 + m_0 2^0) + (m_{N-1} 2^1 + m_{N-2} 2^0) \quad \text{(Equation 11)}.$$

DSP 504 models the distortion of the ADC associated with the MSBs. Its output signal 508 is subtracted from signal 510. The resulting adaptation signal 512 is approximately the LSBs without the distortion. In other words, the bits in signal 512 are approximately random; any correlation in the signal is mainly due to the difference between the DSP's model and the actual distortion function. Signal 512 is fed back to the DSP for adapting its operations to filter out any interference between the MSBs and the LSBs. In some embodiments where the correlation is nonlinear, the DSP is a nonlinear filter. Details of a nonlinear DSP will be discussed in FIGS. 9A and 9B.

Figure 6:
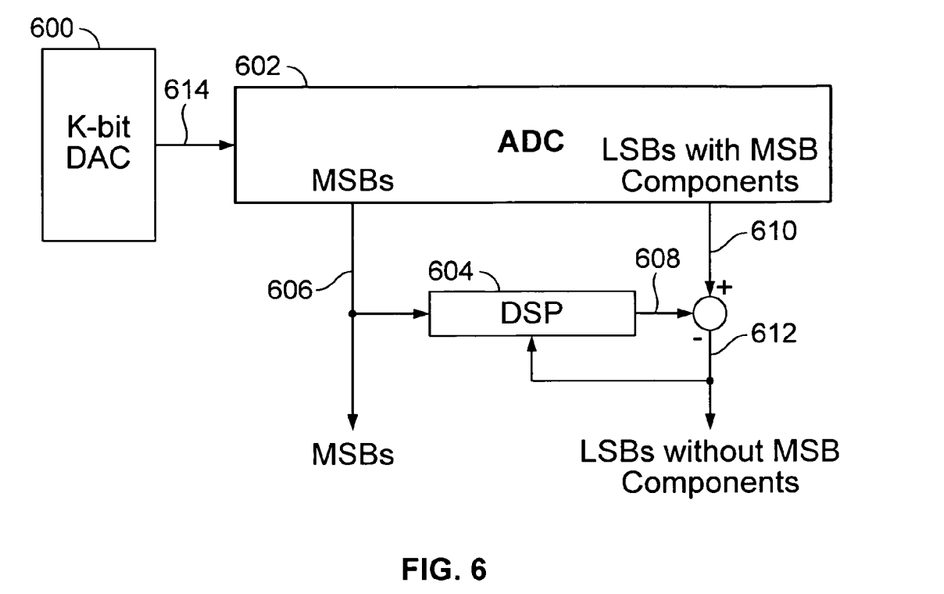
FIG. 6 is a block diagram illustrating another distortion correcting analog to digital converter embodiment trained using a low noise digital to analog converter.

FIG. 6 is a block diagram illustrating another distortion correcting analog to digital converter embodiment trained using a low noise digital to analog converter. ADC 602 has N bits of linearity. DAC 600 is a low noise K-bit DAC, where K is preferably less than N. DAC 600 preferably has better than N bits of linearity. The DAC provides an input signal 614 to the ADC. In this embodiment, the output of ADC 602, w, is the same as what was shown in Equation 8. Output signal 606 of the ADC includes two MSBs, and can be expressed as Equation 9.

Since DAC 600 has fewer bits than ADC 602, the LSBs of the ADC would be zero if the ADC were ideal. When distortion is present, the LSBs include components from the MSBs. Output signal 610 of the ADC can be expressed as the following:

$$y_{LSBE} = m_{N-1}2^1 + m_{N-2}2^0 \quad \text{(Equation 12)}.$$

DSP 604 converges to provide an output 608 that cancels signal 610. The resulting adaptation signal 612 is fed back to the DSP for adjusting its output to more closely match signal 610. Using a low noise DAC to provide training signals allows the DSP to more quickly converge.

Figure 7:
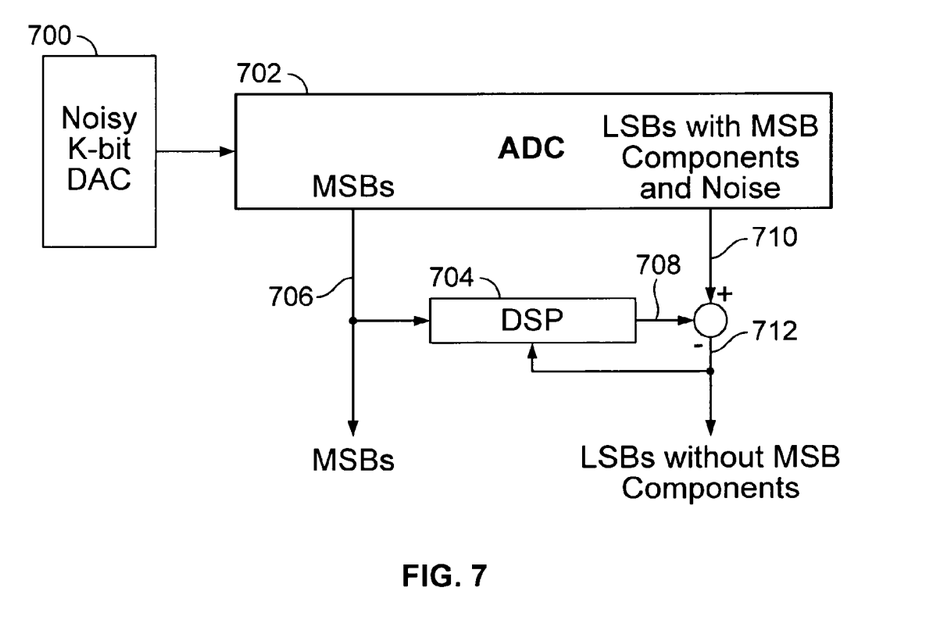
FIG. 7 is a block diagram illustrating another distortion correcting analog to digital converter embodiment trained using a noisy digital to analog converter.

FIG. 7 is a block diagram illustrating another distortion correcting analog to digital converter embodiment trained using a noisy digital to analog converter. The circuitry is similar to that of FIG. 6, although DAC 700 may be a non-ideal, noisy K-bit DAC, where K is preferably less than N. Different types of non-ideal DACs may be used, for example, a dynamic element matching (DEM) DAC. Output signal 706 of ADC 702 includes two MSBs, and can be expressed as Equation 9. Output signal 710 of the ADC includes MSB components and noise. It can be expressed as:

$$y_{LSBE} = m_{N-1}2^1 + m_{N-2}2^0 + u \quad \text{(Equation 13)}.$$

DSP 704 converges to provide an output 708 that cancels signal 710. The resulting adaptation signal 712 is fed back to the DSP for adjusting its output to more closely match signal 710. A DSP trained with a noisy DAC converges more slowly than a DSP trained with a low noise DAC, but tends to be more cost effective since noisy DACs are generally cheaper than low noise DACs.

It should be noted that the training signals used in FIGS. 5-7 usually cover the full frequency spectrum of the ADC, thereby achieving distortion correction for the operating frequencies of the ADC.

Figure 8:
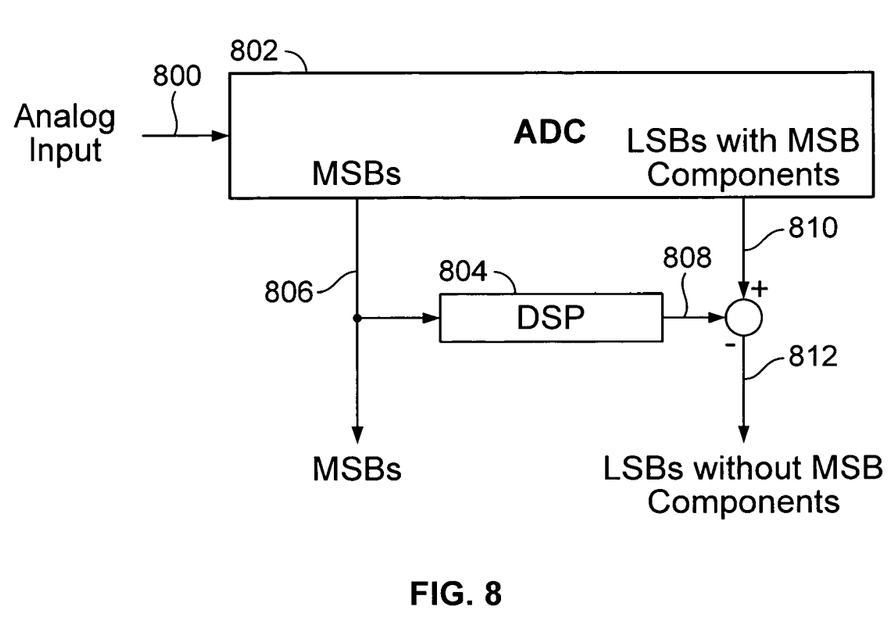
FIG. 8 is a block diagram illustrating the steady state configuration of a distortion correcting analog to digital converter, according to one embodiment of the present invention.

FIG. 8 is a block diagram illustrating the steady state configuration of a distortion correcting analog to digital converter, according to one embodiment of the present invention. The DCADC ends its training period and enters steady state operation once its calibration module has converged. During steady state operation, the adaptation feedback path of the DSP is disconnected. Analog input signal 800 is sent to an ADC 802 to be converted to digital. Output signal 806 of the ADC includes the MSBs, and output signal 810 of the ADC includes the LSBs with distortion. Signal 806 is sent to DSP 804, which utilizes the coefficients it acquired during the training period to duplicate the distortion and generate an output signal 808. Signal 808 is subtracted from signal 810, resulting in signal 812 that is approximately the ideal lower order output bits of the ADC. This configuration is applicable generally to the steady state operation of DCADCs, including the ones shown in FIGS. 5-7.

Figure 9A:
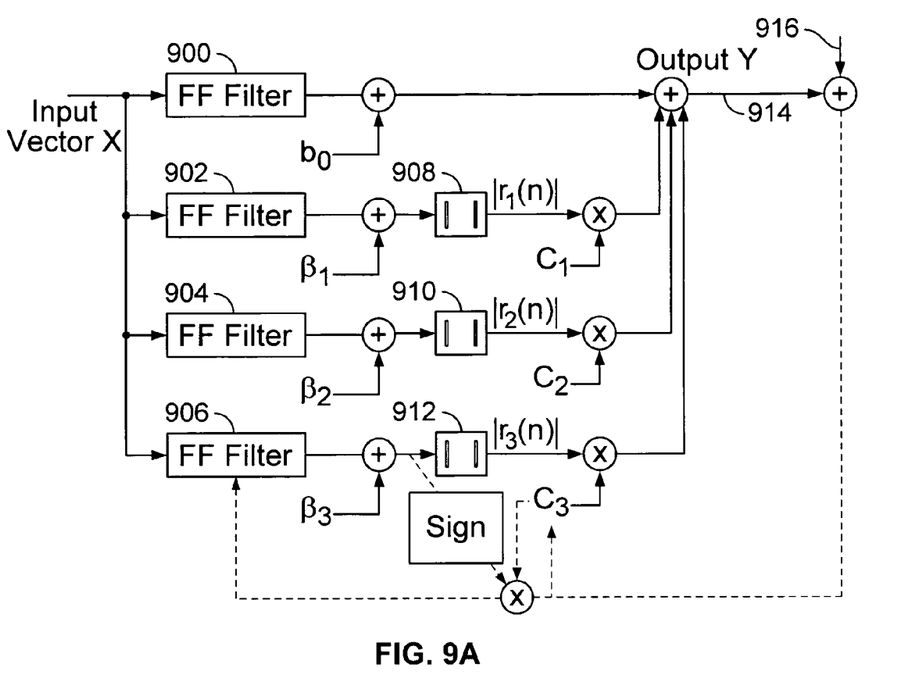
FIG. 9A is a block diagram illustrating the details of a digital signal processor used in a distortion correcting analog to digital converter, according to one embodiment of the present invention.
Figure 9B:
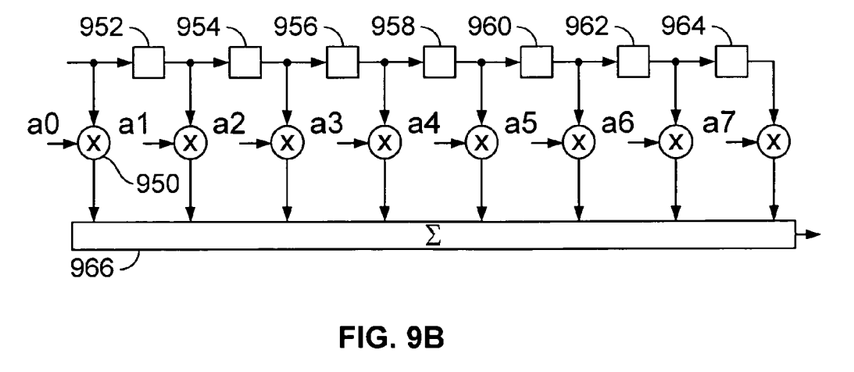
FIG. 9B illustrates the details of linear filter 900 shown in FIG. 9A.

The distortion of the ADC is often nonlinear. Compensating for nonlinear effects of the ADC is a difficult task using traditional techniques. In U.S. patent application Ser. No. 10/372,638 by Batruni, filed Feb. 21, 2003 entitled: "NONLINEAR FILTER" which is herein incorporated by reference for all purposes and U.S. patent application Ser. No. 10/418,944 by Batruni filed Apr. 18, 2003 entitled: "NONLINEAR INVERSION" which is herein incorporated by reference for a1 purposes, Batruni described improved techniques for building nonlinear filters using linear elements, and for adapting such nonlinear filters to achieve desired transfer characteristics. These techniques greatly reduce the complexity associated with the compensation of nonlinear effects, and may be applied to the design and configuration of the DCADCs. FIGS. 9A-9B illustrate some of the techniques.

FIG. 9A is a block diagram illustrating the details of a digital signal processor used in a distortion correcting analog to digital converter, according to one embodiment of the present invention. An input vector X is sent to a bank of linear feed forward filters (900, 902, 904 and 906). The filter outputs are combined with several coefficients ($b_0$, $\beta_1$, $\beta_2$ and $\beta_3$) and then processed by a bank of nonlinear processors. In this embodiment, the nonlinear processors are implemented as absolute value operators (908, 910 and 912). The results from the absolute value operations are multiplied with coefficients $C_1$, $C_2$ and $C_3$, and combined to form an output signal 914. The transfer characteristics of the DSP can be expressed as the following:

$$Y = ax + b + c_1|\alpha_1 x + \beta_1| + c_2|\alpha_2 x + \beta_2| + c_2|\alpha_2 x + \beta_2| + c_3|\alpha_3 x + \beta_3|$$ (Equation 14).

During training, the DSP adapts its transfer function by adjusting its coefficients, using techniques such as the least mean squared (LMS) algorithm and the back-propagation property of derivatives to better model the distortion component of signal 916.

FIG. 9B illustrates the details of linear filter 900 shown in FIG. 9A. The input vector X is scaled by a factor $a_0$ using a multiplier 950. The input is also sent to a plurality of delay stages (952-964). The delayed signals are scaled by factors of a1-a7, respectively. The scaled signals are combined by a combiner 966.

Figure 10:
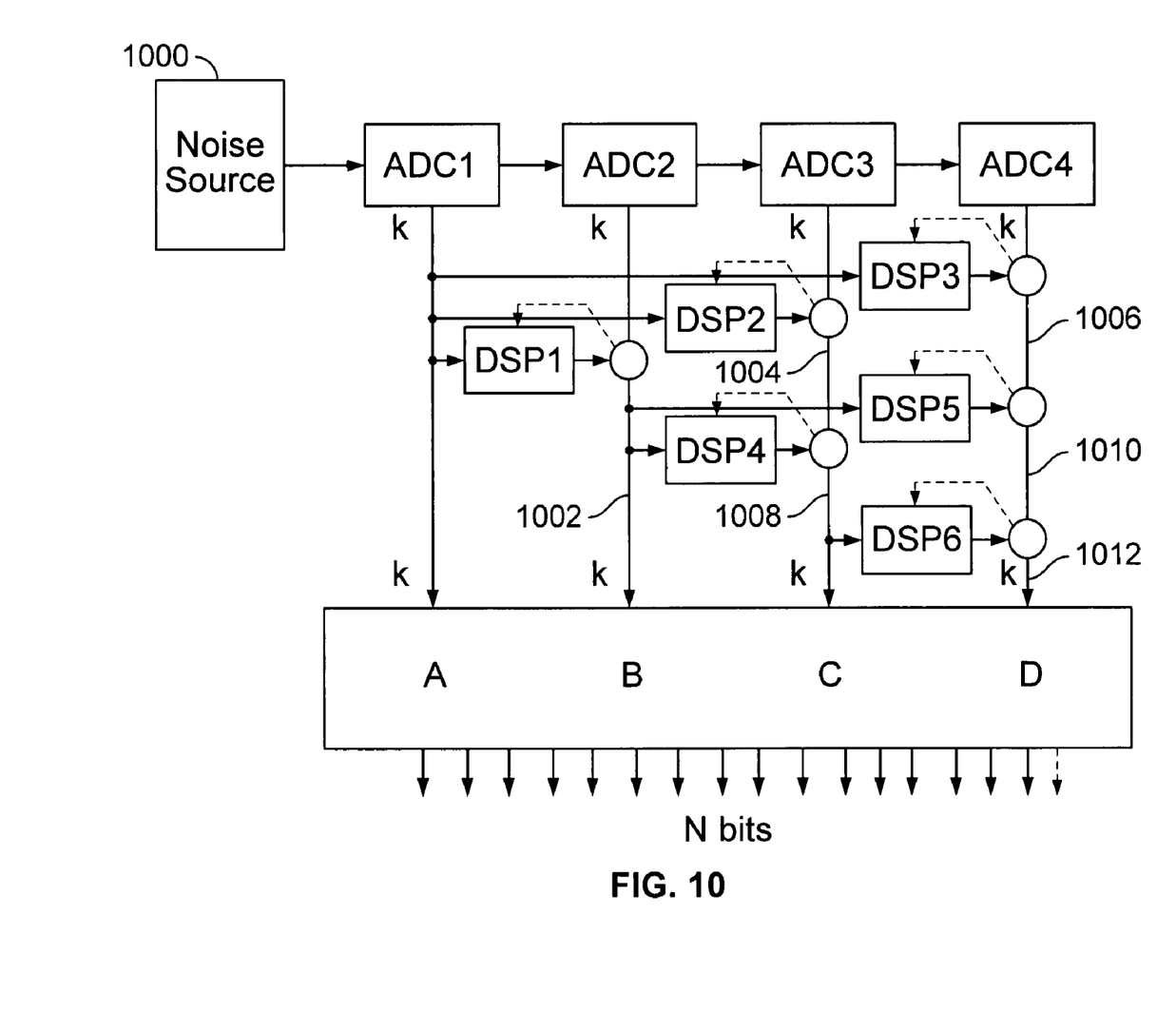
FIG. 10 is a block diagram illustrating a multi-stage distortion correcting analog to digital receiver, according to an embodiment of the present invention.

FIG. 10 is a block diagram illustrating a multi-stage distortion correcting analog to digital receiver, according to an embodiment of the present invention. The input is a noise source 1000. Four k-bit ADCs ADC 1 are used to generate the outputs of an ADC that has 4 k bits. In this embodiment, k is 5. Several DSPs are coupled to the ADC stages to cancel the interference effect of the higher order bits on the lower order bits. Once the effects of the higher order bits are removed from the lower order bits, the resulting bits then undergo the same process of removing their effects from the bits of yet a lower order. ADC1 generates the highest order bits, A, expressed as $m_{19}2^{19} + m_{18}2^{18} + m_{17}2^{17} + m_{16}2^{16} + m_{15}2^{15}$. The highest order bits are sent to DSP1 that is trained to remove the interference effect of the highest order bits from the lower order bits generated by ADC 1004. The resulting distortion corrected signal 1002 is expressed as $n_{14}2^{14} + n_{13}2^{13} + n_{12}2^{12} + n_{11}2^{11} + n_{10}2^{10}$.

The output of ADC 1 is also sent to DSP2 and DSP3 for removing the interference effects from the lower order bits generated by ADC3 and ADC4, respectively, to obtain signals 1004 and 1006. The distortion corrected signal 1002 is also sent to DSP4 and DSP5 to further remove any interference effects it may have on the lower order bits generated by the DSPs. Similarly, signal 1008 is sent to DSP6, which is trained to remove any interference present in signal 1010. The distortion corrected output signals 1008 and 1012 are expressed as $n_9 2^9 + n_8 2^8 + n_7 2^7 + n_6 2^6 + n_5 2^5$ and $n_4 2^4 + n_3 2^3 + n_2 2^2 + n_1 2^1 + n_0 2^0$, respectively.

It should be noted that the number of bits in the ADC stages, the number of stages and the number of DSPs used are implementation dependent. The same general architecture can be modified to use different numbers of ADC stages and DSPs.

The calibration module in a DCADC may also be used to correct distortion in the overall circuit that includes the DCADC. A receiver circuit example is discussed for the purposes of illustration, although it should be noted that the DCADC can also be used for correcting distortion in transmitter circuits or any other appropriate circuits.

Figure 11:
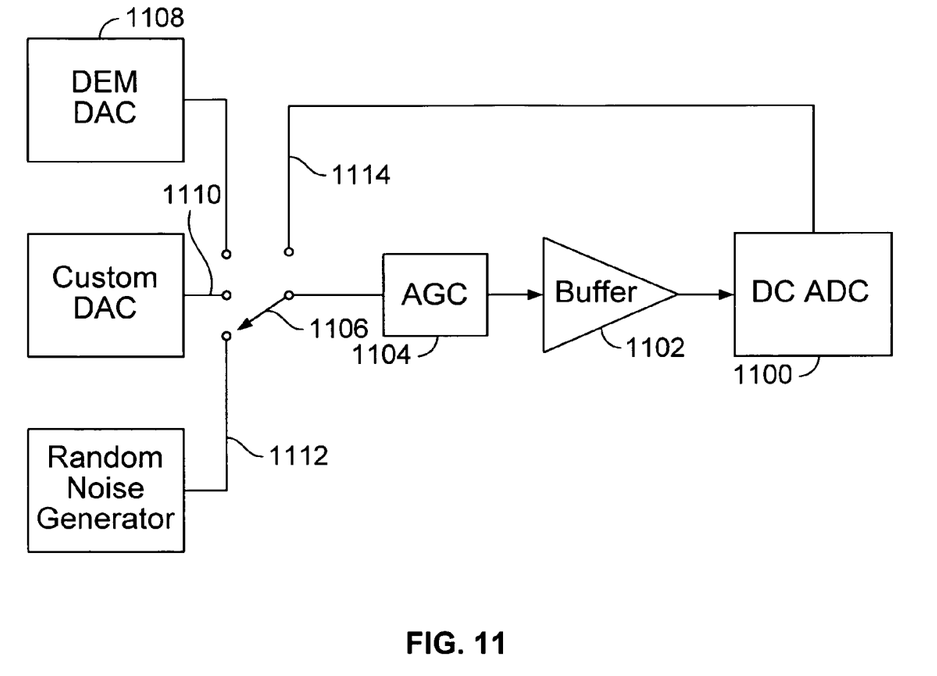
FIG. 11 is a block diagram illustrating a receiver circuit that includes a distortion correcting analog to digital converter, according to one embodiment of the present invention.

FIG. 11 is a block diagram illustrating a receiver circuit that includes a distortion correcting analog to digital converter, according to one embodiment of the present invention. The receiver circuit includes an automatic gain control (AGC) 1104, a buffer 1102, and a DCADC 1100. There are several signal sources available for training the circuit, including a DEM DAC 1108, a custom low noise DAC 1110, and a random noise generator 1112. Switch 1106 selects one of the signal sources during the training process. The calibration module in DCADC 1100 adapts to correct not only the distortion in the ADC itself, but also the distortion introduced by the AGC and the buffer. Once training is completed, switch 1106 connects to interface 1114 and the circuit operates in its steady state mode, where distortion in the overall circuit is corrected by the calibration module of the DCADC.

An improved technique for correcting an output distortion has been disclosed. Several embodiments that employ calibration modules to compensate the distortion have been discussed. The technique provides low distortion output over a wide spectrum without significantly increasing the production cost of the ADC.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A method of correcting for output distortion of an analog to digital converter (ADC) having an output that includes a plurality of output bits, comprising:

estimating the output distortion to obtain an estimated distortion, wherein:

the plurality of output bits include a plurality of higher order bits and at least one lower order bit;

the estimation is based at least in part on the plurality of higher order bits of the output but is not based on the at least one lower order bit;

combining the output of the ADC with the estimated distortion to compensate for the output distortion; and training a calibration module; wherein the calibration module includes a plurality of linear filters having a plurality of coefficients, and wherein training the calibration module includes sending the output to the calibration module and feeding back an error adaptation signal to adapt the plurality of coefficients.

2. A method as recited in claim 1, further comprising training a calibration module.

3. A method as recited in claim 2, further comprising disconnecting an adaptation path after training.

4. A method as recited in claim 2, wherein the calibration module is trained to model a distortion function of the ADC.

5. A method as recited in claim 2, wherein the calibration module is trained to model a distortion function of the ADC, the distortion function being a nonlinear function of at least some of the plurality of higher order bits of the ADC.

6. A method as recited in claim 2, wherein training the calibration module includes sending the output to the calibration module and feeding back an error adaptation signal to adapt the calibration module.

7. A method as recited in claim 1, wherein estimating the output distortion includes determining interference effect of one or more higher order bits of the output on one or more lower order bits of the output.

8. A method of correcting for output distortion of an analog to digital converter (ADC) having an output that includes a plurality of output bits that includes a plurality of higher order bits and at least one lower order bit, comprising:

estimating the output distortion to obtain an estimated distortion, wherein estimation of the output distortion is based at least in part on at least some of the plurality of higher order bits of the output but is not based on the at least one lower order bit, and the estimation includes performing a nonlinear operation that is equivalent to an absolute value operation that operates on at least some of the plurality of higher order bits but does not operate on the at least one lower order bit; and combining the output of the ADC with the estimated distortion to compensate for the output distortion.

9. A distortion correcting analog to digital converter system comprising:

an analog to digital converter (ADC) having an output with an output distortion, the output comprising a plurality of output bits including a plurality of higher order bits and at least one lower order bit; and a calibration module coupled to the ADC, configured to estimate the output distortion to obtain an estimated distortion, wherein the estimated distortion is based at least in part on the plurality of higher order bits of the output but is not based on the at least one lower order bit;

wherein the calibration module includes a plurality of linear filters having a plurality of coefficients, and wherein the calibration module is configured to be trained, including by sending the output to the calibration module and feeding back an error adaptation signal to adapt the plurality of coefficients.

10. A system as recited in claim 9, wherein the calibration module is configured to be trainable.

11. A system as recited in claim 10, wherein the calibration module is further configured to disconnect an adaptation path after training.

12. A system as recited in claim 10, wherein the calibration module is trained to model a distortion function of the ADC.

13. A system as recited in claim 10, wherein the calibration module is trained to model a distortion function of the ADC, the distortion function being a nonlinear function of one or more of the plurality of higher order bits.

14. A system as recited in claim 10, wherein the calibration module is trained, including by sending the output to the calibration module and feeding back an error adaptation signal to adapt the calibration module.

15. A distortion correcting analog to digital converter system comprising:

an analog to digital converter (ADC) having an output with an output distortion, the output comprising a plurality of output bits that includes a plurality of higher order bits and at least one lower order bit; and a calibration module coupled to the ADC, configured to estimate the output distortion to obtain an estimated distortion, wherein the estimated distortion is based at least in part on at least some of the plurality of higher order bits but is not based on the at least one lower order bit;

wherein the calibration module estimates the output distortion, including by performing a nonlinear operation that is equivalent to an absolute value operation that operates on at least some of the plurality of higher order bits but does not operate on the at least one lower order bit.

16. A system as recited in claim 9, wherein to estimate the output distortion includes to determine interference effect of one or more higher order bits of the output on one or more lower order bits of the output.

* * * * *